United States Patent
Chen et al.

(10) Patent No.: US 9,490,167 B2
(45) Date of Patent: Nov. 8, 2016

(54) POP STRUCTURES AND METHODS OF FORMING THE SAME

(71) Applicant: Taiwan Semiconductor Manufacturing Company, Ltd., Hsin-Chu (TW)

(72) Inventors: Hsu-Hsien Chen, Hsin-Chu (TW); Chih-Hua Chen, Zhubei (TW); En-Hsiang Yeh, Hsin-Chu (TW); Monsen Liu, Zhudong Township (TW); Chen-Shien Chen, Zhubei (TW)

(73) Assignee: Taiwan Semiconductor Manufactoring Company, Ltd., Hsin-Chu (TW)

( * ) Notice: Subject to any disclaimer, the term of this patent is extended or adjusted under 35 U.S.C. 154(b) by 0 days.

(21) Appl. No.: 14/618,446

(22) Filed: Feb. 10, 2015

(65) Prior Publication Data

US 2015/0155203 A1 Jun. 4, 2015

Related U.S. Application Data

(62) Division of application No. 13/649,941, filed on Oct. 11, 2012, now Pat. No. 8,975,726.

(51) Int. Cl.
*H01L 21/768* (2006.01)
*H01L 23/00* (2006.01)
(Continued)

(52) U.S. Cl.
CPC ..... *H01L 21/76885* (2013.01); *H01L 21/6835* (2013.01); *H01L 23/5389* (2013.01); *H01L 24/19* (2013.01); *H01L 24/83* (2013.01); *H01L 25/03* (2013.01); *H01L 25/105* (2013.01); *H01L 25/16* (2013.01); *H01L 21/568* (2013.01); *H01L 24/97* (2013.01); *H01L 2221/6834* (2013.01);
(Continued)

(58) Field of Classification Search
CPC .......... H01L 21/76885; H01L 21/6835; H01L 21/568; H01L 23/5389; H01L 24/83; H01L 24/19; H01L 24/97; H01L 25/03; H01L 25/105; H01L 25/16
See application file for complete search history.

(56) References Cited

U.S. PATENT DOCUMENTS 6,281,046 B1  8/2001  Lam
6,335,565 B1  1/2002  Miyamoto et al.
(Continued)

FOREIGN PATENT DOCUMENTS

CN  101315924     12/2008
CN  102034718 A   4/2011
(Continued)

OTHER PUBLICATIONS

Cheah, Bok Eng, et al., "A Novel Inter-Package Connection for Advanced Package-on-Package Enabling," IEEE Electronic Components and Technology Conference, May 31, 2011-Jun. 3, 2011, pp. 589-594.
(Continued)

*Primary Examiner* — Whitney T Moore
(74) *Attorney, Agent, or Firm* — Slater Matsil, LLP

(57) ABSTRACT

A device includes a top package bonded to a bottom package. The bottom package includes a molding material, a device die molded in the molding material, a Through Assembly Via (TAV) penetrating through the molding material, and a redistribution line over the device die. The top package includes a discrete passive device packaged therein. The discrete passive device is electrically coupled to the redistribution line.

20 Claims, 10 Drawing Sheets

(51) Int. Cl.
  *H01L 23/538* (2006.01)
  *H01L 21/683* (2006.01)
  *H01L 25/03* (2006.01)
  *H01L 25/10* (2006.01)
  *H01L 25/16* (2006.01)
  *H01L 21/56* (2006.01)

(52) U.S. Cl.
  CPC ............ *H01L 2221/68327* (2013.01); *H01L 2221/68372* (2013.01); *H01L 2224/12105* (2013.01); *H01L 2224/16225* (2013.01); *H01L 2224/73267* (2013.01); *H01L 2224/97* (2013.01); *H01L 2225/1035* (2013.01); *H01L 2225/1058* (2013.01); *H01L 2924/15311* (2013.01); *H01L 2924/181* (2013.01); *H01L 2924/19041* (2013.01); *H01L 2924/19105* (2013.01)

(56) References Cited

U.S. PATENT DOCUMENTS

| | | |
|---|---|---|
| 7,105,920 B2 | 9/2006 | Su et al. |
| 7,573,136 B2 | 8/2009 | Jiang et al. |
| 8,093,722 B2 | 1/2012 | Chen |
| 8,105,875 B1 | 1/2012 | Hu et al. |
| 8,138,014 B2 | 3/2012 | Chi et al. |
| 8,143,097 B2 | 3/2012 | Chi et al. |
| 8,263,439 B2 | 9/2012 | Marimuthu et al. |
| 8,293,580 B2 | 10/2012 | Kim et al. |
| 8,361,842 B2 | 1/2013 | Yu et al. |
| 8,435,835 B2 | 5/2013 | Pagaila et al. |
| 8,476,769 B2 | 7/2013 | Chen et al. |
| 8,503,186 B2 | 8/2013 | Lin et al. |
| 8,508,045 B2 | 8/2013 | Khan et al. |
| 8,604,568 B2 | 12/2013 | Stacey |
| 8,710,657 B2 | 4/2014 | Park et al. |
| 8,736,035 B2 | 5/2014 | Hwang et al. |
| 8,754,514 B2 | 6/2014 | Yu et al. |
| 8,791,016 B2 | 7/2014 | Gambino et al. |
| 8,928,114 B2 | 1/2015 | Chen et al. |
| 8,957,525 B2 | 2/2015 | Lyne et al. |
| 9,048,306 B2 | 6/2015 | Chi et al. |
| 9,087,835 B2 | 7/2015 | Sutardja et al. |
| 2002/0117743 A1 | 8/2002 | Nakatani et al. |
| 2004/0187297 A1 | 9/2004 | Su et al. |
| 2004/0256731 A1 | 12/2004 | Mao et al. |
| 2006/0043549 A1 | 3/2006 | Hsu |
| 2006/0133056 A1 | 6/2006 | Wyrzykowska et al. |
| 2007/0161266 A1 | 7/2007 | Nishizawa |
| 2008/0006936 A1 | 1/2008 | Hsu |
| 2008/0142976 A1 | 6/2008 | Kawano |
| 2008/0220563 A1 | 9/2008 | Karnezos |
| 2008/0277800 A1 | 11/2008 | Hwang et al. |
| 2009/0057862 A1 | 3/2009 | Ha et al. |
| 2009/0155957 A1 | 6/2009 | Chen et al. |
| 2009/0230535 A1* | 9/2009 | Otremba .............. H01L 21/561 257/690 |
| 2010/0112756 A1 | 5/2010 | Amrine et al. |
| 2010/0127345 A1 | 5/2010 | Sanders et al. |
| 2010/0133704 A1 | 6/2010 | Marimuthu et al. |
| 2010/0140779 A1 | 6/2010 | Lin et al. |
| 2010/0155126 A1 | 6/2010 | Kunimoto et al. |
| 2010/0155922 A1 | 6/2010 | Pagaila et al. |
| 2010/0237482 A1 | 9/2010 | Yang et al. |
| 2011/0024902 A1 | 2/2011 | Lin et al. |
| 2011/0024916 A1 | 2/2011 | Marimuthu et al. |
| 2011/0037157 A1 | 2/2011 | Shin et al. |
| 2011/0062592 A1 | 3/2011 | Lee et al. |
| 2011/0090570 A1 | 4/2011 | DeCusatis et al. |
| 2011/0156247 A1 | 6/2011 | Chen et al. |
| 2011/0163391 A1 | 7/2011 | Kinzer et al. |
| 2011/0186960 A1 | 8/2011 | Wu et al. |
| 2011/0215464 A1 | 9/2011 | Guzek et al. |
| 2011/0241218 A1 | 10/2011 | Meyer et al. |
| 2011/0260336 A1 | 10/2011 | Kang et al. |
| 2012/0038053 A1 | 2/2012 | Oh et al. |
| 2012/0049346 A1 | 3/2012 | Lin et al. |
| 2012/0056312 A1 | 3/2012 | Pagaila et al. |
| 2012/0139068 A1 | 6/2012 | Stacey |
| 2012/0161315 A1 | 6/2012 | Lin |
| 2012/0208319 A1 | 8/2012 | Meyer |
| 2012/0273960 A1 | 11/2012 | Park et al. |
| 2012/0319294 A1 | 12/2012 | Lee et al. |
| 2012/0319295 A1 | 12/2012 | Chi et al. |
| 2013/0009322 A1 | 1/2013 | Conn et al. |
| 2013/0009325 A1 | 1/2013 | Mori et al. |
| 2013/0062760 A1 | 3/2013 | Hung et al. |
| 2013/0062761 A1 | 3/2013 | Lin et al. |
| 2013/0093078 A1 | 4/2013 | Lin et al. |
| 2013/0105991 A1 | 5/2013 | Gan et al. |
| 2013/0111123 A1 | 5/2013 | Thayer |
| 2013/0181325 A1 | 7/2013 | Chen et al. |
| 2013/0182402 A1 | 7/2013 | Chen et al. |
| 2013/0234322 A1 | 9/2013 | Pendse |
| 2013/0256836 A1 | 10/2013 | Hsiao et al. |
| 2013/0334697 A1 | 12/2013 | Shin et al. |
| 2014/0070422 A1 | 3/2014 | Hsiao et al. |
| 2014/0091473 A1 | 4/2014 | Len et al. |
| 2014/0110856 A1 | 4/2014 | Lin |
| 2014/0264836 A1 | 9/2014 | Chun et al. |
| 2015/0093881 A1 | 4/2015 | Chen et al. |
| 2015/0115464 A1 | 4/2015 | Yu et al. |
| 2015/0115470 A1 | 4/2015 | Su et al. |

FOREIGN PATENT DOCUMENTS

| | | |
|---|---|---|
| CN | 102157391 A | 8/2011 |
| KR | 101099578 | 5/2011 |
| KR | 1020120075855 | 7/2012 |
| KR | 1020120094182 | 8/2012 |
| KR | 1020120098844 | 9/2012 |
| TW | 200919632 | 5/2009 |
| TW | 201230266 A | 7/2012 |

OTHER PUBLICATIONS

Zhang, Y., et al., "Lead-Free Bumping and It's Challenges," IWPLC Conference Proceedings, Oct. 10, 2004, 8 pages.

* cited by examiner

POP STRUCTURES AND METHODS OF FORMING THE SAME

PRIORITY CLAIM AND CROSS-REFERENCE

This application is a divisional of U.S. patent application Ser. No. 13/649,941, entitled "POP Structures and Methods of Forming the Same," filed on Oct. 11, 2012, which application is incorporated herein by reference.

BACKGROUND

In integrated circuit applications, more and more functions are integrated into products. For example, different functional elements such as 3G video elements, WiFi elements, Bluetooth elements, and audio/video elements may need to be integrated together to form an application.

In conventional integration schemes, different components are bonded to an interposer, which is further bonded to a package substrate. For example, in mobile applications, a power management integrated circuit die, a transceiver die, and a multi-layer ceramic capacitor may be bonded using this scheme. The resulting package is typically very thick and large in area. In addition, since the various components that are bonded to the interposer are connected to the interposer through many electrical connections, the pitch of the electrical connections of the interposer need to be very small, and sometimes as small as about 40 nm to 50 nm. Such small pitch requires the interposer to use micro-bumps (u-bumps), whose formation still faces technical challenges.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Package-On-Package (POP) structure and the methods of forming the same are provided in accordance with various exemplary embodiments. The intermediate stages of forming the package structure are illustrated. The variations of the embodiments are discussed. Throughout the various views and illustrative embodiments, like reference numbers are used to designate like elements.

Figure 1:
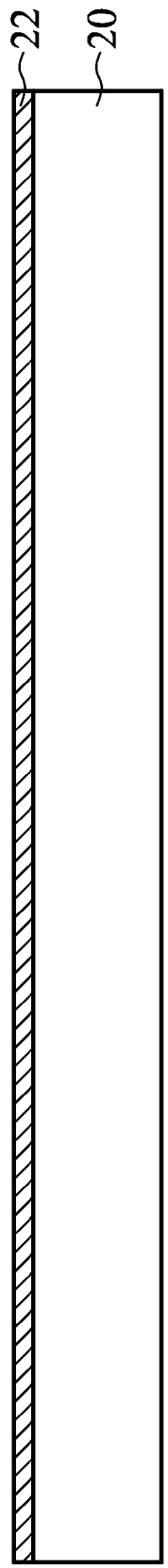
FIGS. 1 through 10 are cross-sectional views of intermediate stages in the manufacturing of a Package-On-Package (POP) structure in accordance with some exemplary embodiments, wherein device dies are embedded in the POP package.

FIGS. 1 through 10 are cross-sectional views of intermediate stages in the manufacturing of a POP structure in accordance with some exemplary embodiments. FIG. 1 illustrates carrier 20, and adhesive layer 22 on carrier 20. Carrier 20 may be a glass carrier, a ceramic carrier, or the like. Adhesive layer 22 may be formed of an adhesive such as an Ultra-Violet (UV) glue.

Figure 2:
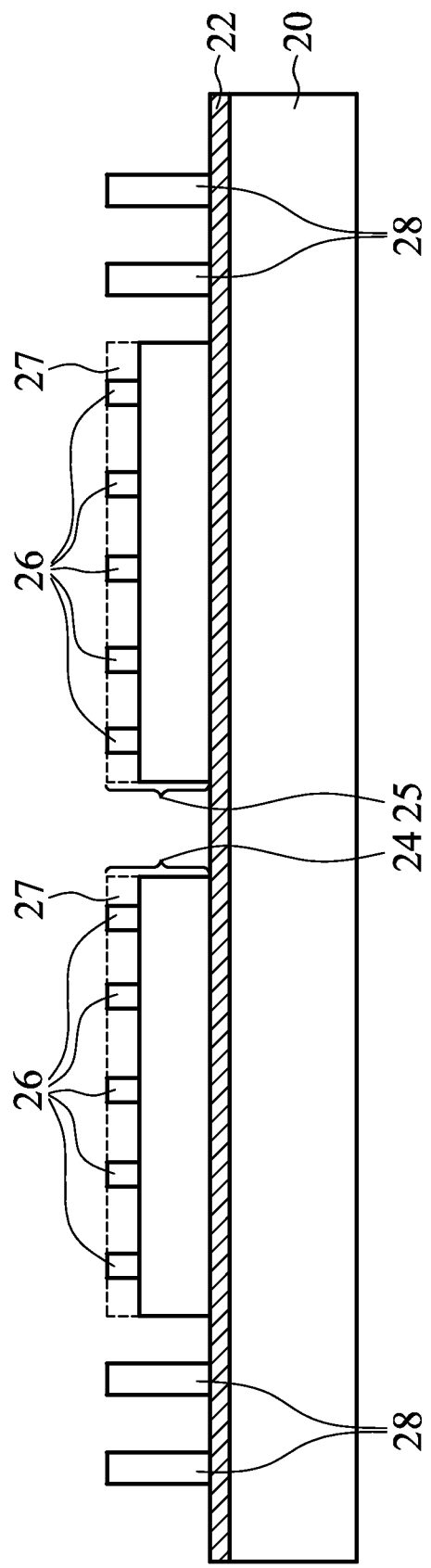

FIG. 2 illustrates the placement of device dies 24 and 25, and the formation of conductive posts 28. Device dies 24 and 25 are placed over carrier 20, for example, through adhesive layer 22, and are level with each other. Device dies 24 and 25 may be logic device dies including logic transistors therein. In some exemplary embodiments, device dies 24 and 25 are dies that are designed for mobile applications, and may include a Power Management Integrated Circuit (PMIC) die and a Transceiver (TRX) die, for example. Although two dies 24 and 25 are illustrated, more dies may be placed over carrier 20 and level with each other.

Throughout the description, conductive posts 28 are alternatively referred to as Through Assembly Vias (TAVs) 28. In some embodiments, TAVs 28 are pre-formed, and are then placed on adhesive layer 22. In alternative embodiments, TAVs 28 may be formed by plating. The plating of TAVs 28 may be performed before the placement of dies 24 and 25, and may include forming a seed layer (not shown) over carrier 20, forming and patterning a photo resist (not shown), and plating TAVs 28 on the portions of the seed layer that are exposed through the photo resist. The photo resist and the portions of the seed layer that were covered by the photo resist may then be removed. Device dies 24 and 25 may then be placed over carrier 20. The material of TAVs 28 may include copper, aluminum, or the like. In the resulting structure in FIG. 2, the bottom ends of TAVs 28 are substantially level with the bottom surface of device dies 24 and 25.

In some exemplary embodiments, metal posts 26 (such as copper posts) are formed as the top portions of device dies 24 and 25, and are electrically coupled to the devices in device dies 24 and 25. In some embodiments, dielectric layers 27 are formed at the top surfaces of device dies 24 and 25, with metal posts 26 having at least lower portions in dielectric layer 27. The top surfaces of dielectric layers 27 may also be substantially level with the top ends of metal posts 26. Alternatively, dielectric layers 27 are not formed, and metal posts 26 protrude above remaining portions of device dies 24 and 25.

Figure 3:
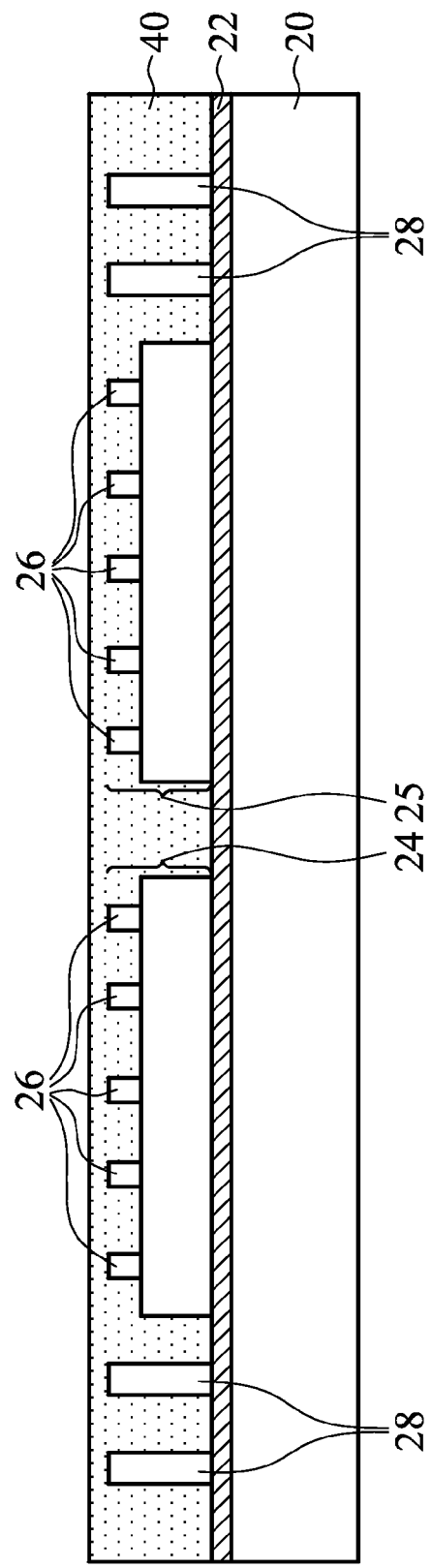
Figure 4:
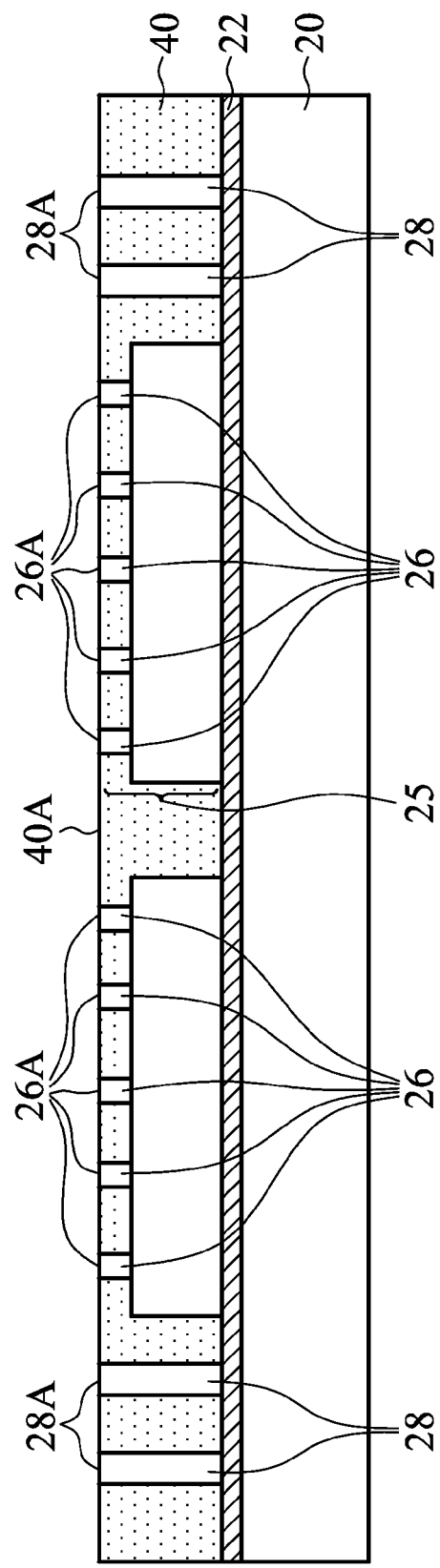

Referring to FIG. 3, molding material 40 is molded on device dies 24 and 25 and TAVs 28. Molding material 40 fills the gaps between device dies 24 and 25 and TAVs 28, and may be in contact with adhesive layer 22. Furthermore, molding material 40 may be filled into the gaps between metal posts 26. Molding material 40 may include a molding compound, a molding underfill, an epoxy, or a resin. The top surface of molding material 40 is higher than the top ends of metal posts 26 and TAVs 28. Next, a thinning step, which may be a grinding step, is performed to thin molding material 40, until metal posts 26 and TAVs 28 are exposed. The resulting structure is shown in FIG. 4. Due to the step of thinning, the top ends 28A of TAVs 28 are substantially level with the top ends 26A of metal posts 26, and are substantially level with top surface 40A of molding material 40.

Figure 5:
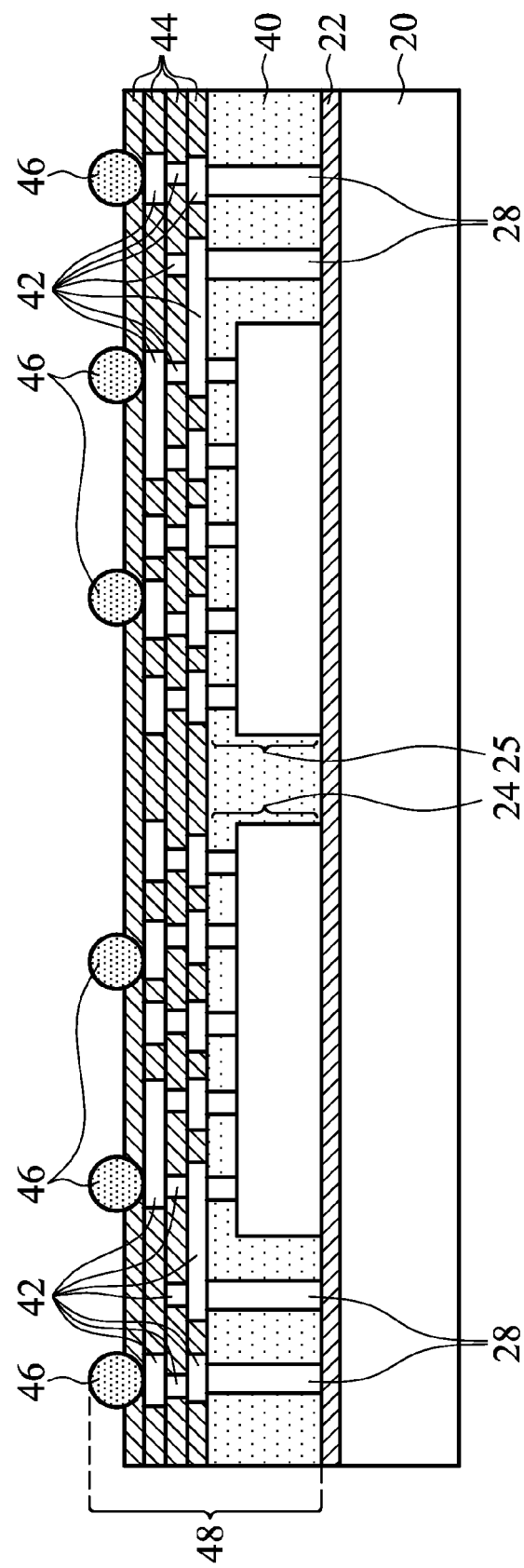

Next, referring to FIG. 5, Redistribution Lines (RDLs) 42 are formed over molding material 40 to connect to metal posts 26 and TAVs 28. RDLs 42 may also interconnect metal posts 26 and TAVs 28. RDLs 42 are formed in dielectric layers 44. In some embodiments, RDLs 42 are formed by depositing metal layers, patterning the metal layers, and fill the gaps between RDLs 42 with dielectric layers 44. In alternative embodiments, RDLs 42 and dielectric layers 44 are formed using damascene processes. RDLs 42 may comprise a metal or a metal alloy including aluminum, copper, tungsten, and/or alloys thereof.

Figure 9:
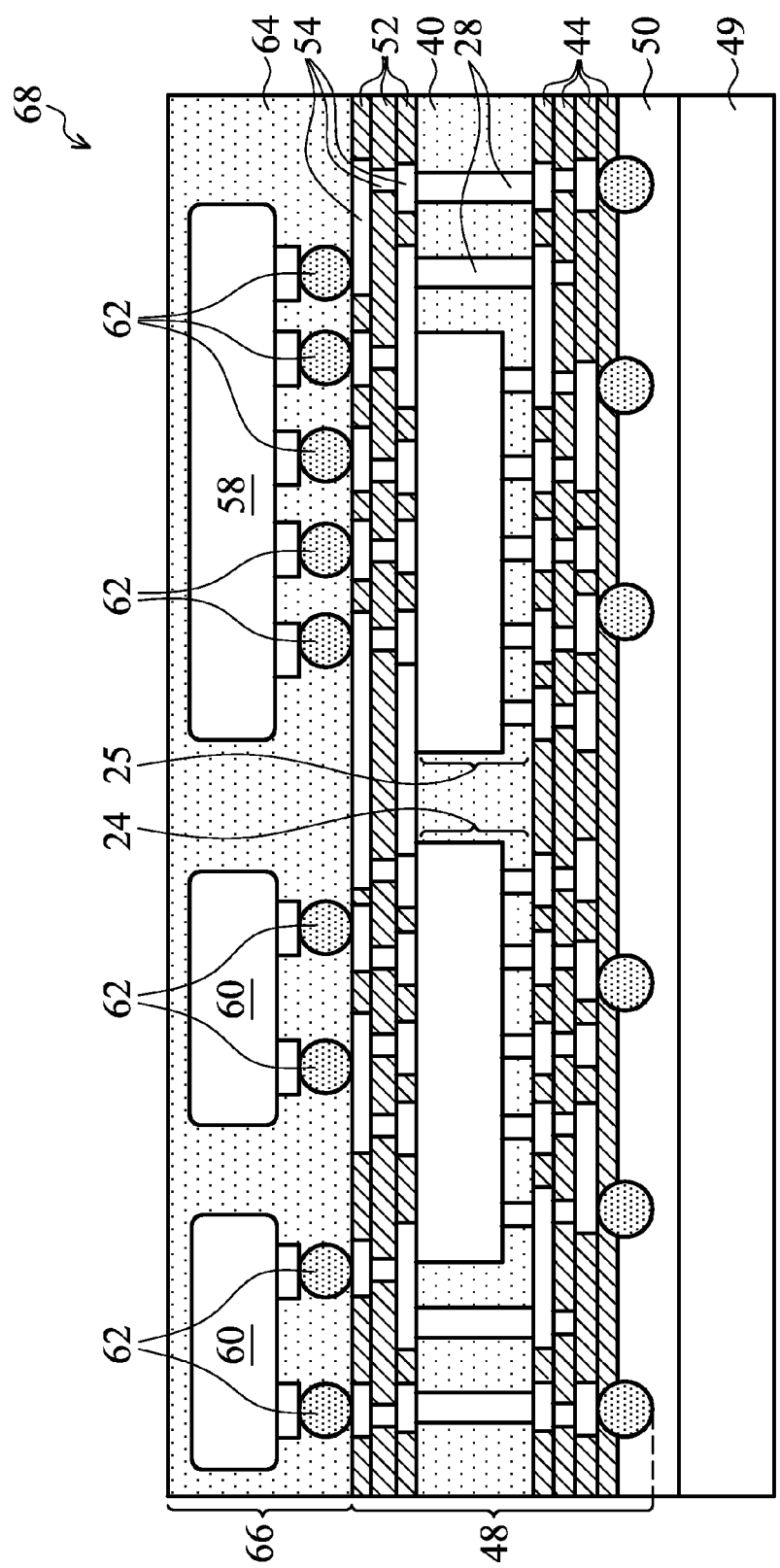

FIG. 5 also illustrates the formation of electrical connectors 46 in accordance with some exemplary embodiments. The formation of connectors 46 may include placing solder balls on the exposed portions of RDLs 42, and then reflowing the solder balls. In alternative embodiments, the formation of connectors 46 includes performing a plating step to form solder regions over RDLs 42, and then reflowing the solder regions. Connectors 46 may also include metal pillars, or metal pillars and solder caps, which may also be formed through plating. Throughout the description, the combined structure including device dies 24 and 25, TAVs 28, molding material 40, and the overlying RDLs 42 and dielectric layers 44 is referred to as package 48, which may have a wafer form in this step. In alternative embodiments, instead of forming electrical connectors 46 at this manufacturing stage, electrical connectors 46 are formed after the bonding of package components 58 and 60, which bonding step is shown in FIG. 9.

Figure 6:
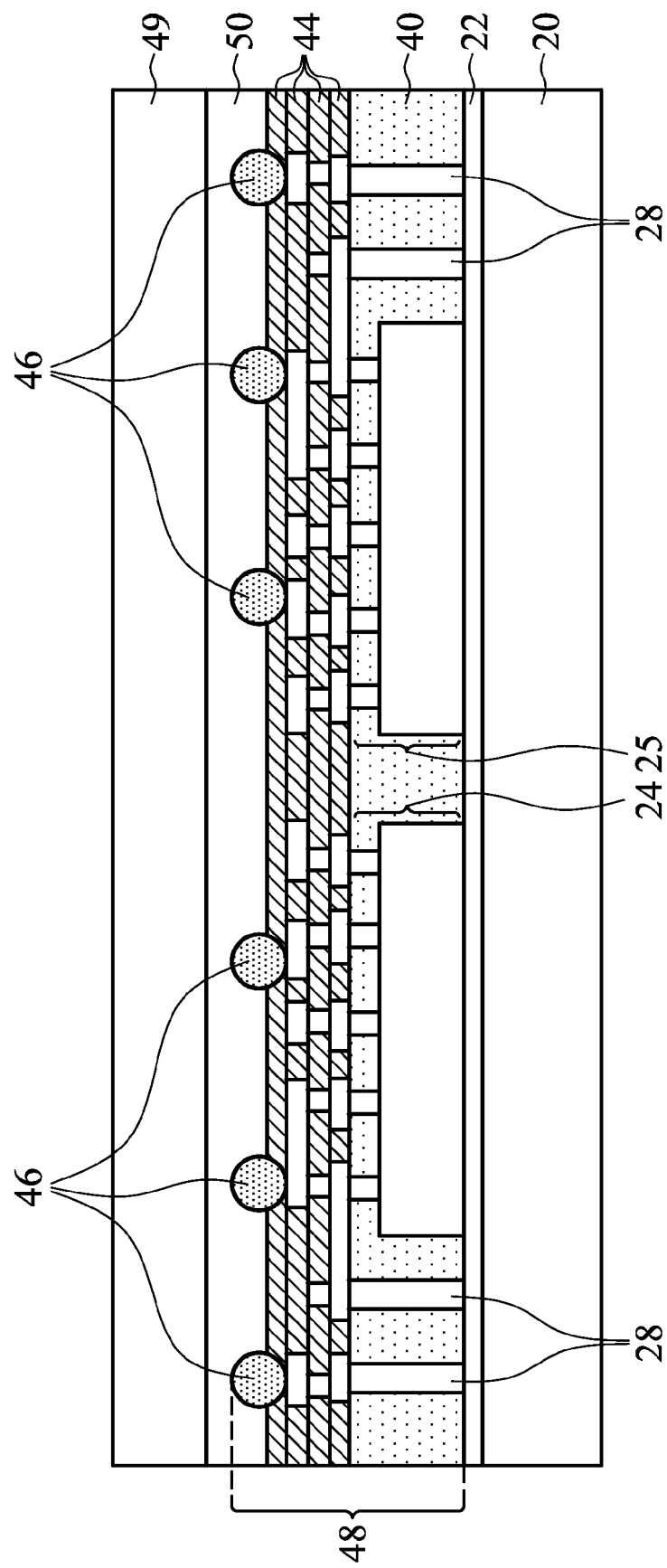

Referring to FIG. 6, a carrier switch is performed. In the carrier switch process, carrier 49 is first attached to package 48, wherein carriers 20 and 49 are on opposite sides of package 48. Carrier 49 may be attached to package 48 through adhesive 50, which may be a UV glue, a tape, or the like. Carrier 20 is then detached from package 48 by causing adhesive layer 22 to lose adhesion. Adhesive layer 22 is then removed. For example, when adhesive layer 22 is formed of the UV glue, adhesive layer 22 may be exposed to UV light, so that adhesive layer 22 loses adhesion, and hence carrier 20 and adhesive layer 22 can be removed from package 48.

Figure 7:
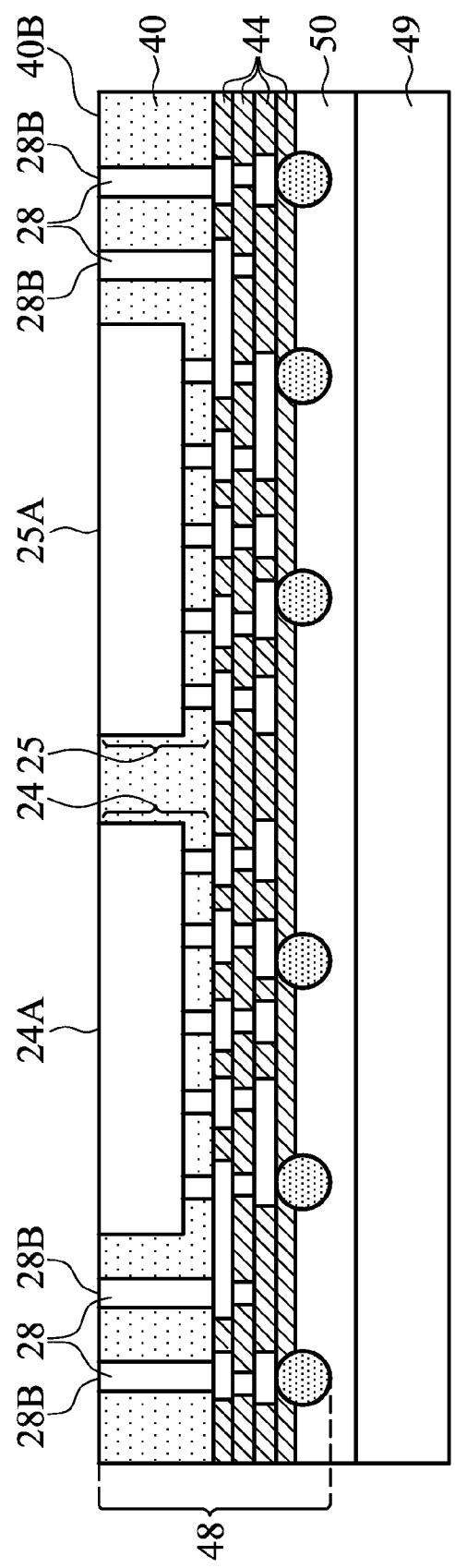

Referring to FIG. 7, after the carrier switch, the back ends 28B of TAVs 28 are exposed. In the illustrated structure, back ends 28B of TAVs 28 are level with back surface 24A of device die 24 and back surface 25A of device die 25. Back ends 28B of TAVs 28 may also be substantially level with surface 40B of molding material 40. In some embodiments, a grinding is performed to lightly grind the back surface of device dies 24 and 25 and TAVs 28. As a result of the grinding, TAVs 28 may protrude slightly above the back surface of device dies 24 and 25, or have their ends 28B level with surfaces 40B, 24A, and 25A. Alternatively, the grinding step is skipped.

Figure 8:
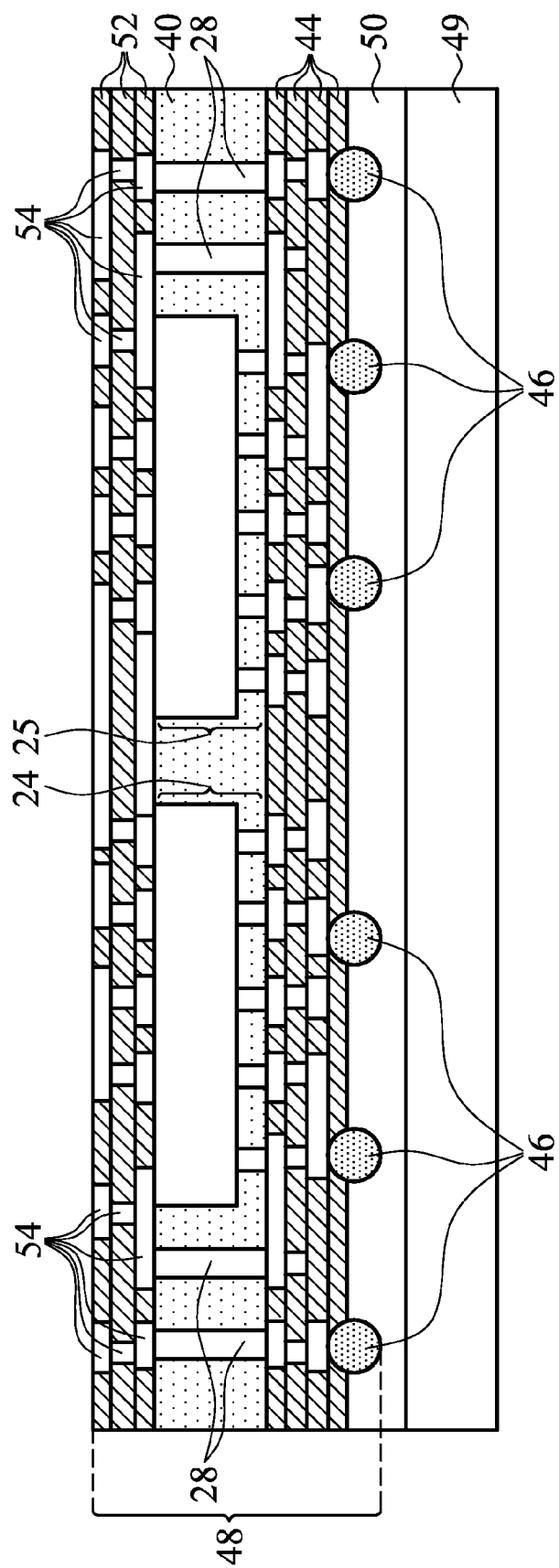

As shown in FIG. 8, dielectric layers 52 and RDLs 54 are formed. In some embodiments, dielectric layers 52 are formed of dielectric materials such as oxides, nitrides, carbides, carbon nitrides, combinations thereof, and/or multi-layers thereof. RDLs 54 are formed in dielectric layer 52 and connected to TAVs 28. Some of RDLs 54 may extend over and aligned to device dies 24 and 25. Accordingly, RDLs 54 have a fan-in structure. For example, the portions of RDLs 54 that are over and aligned to device dies 24 and 25 may be connected to the portions of RDLs 54 that are over and aligned to TAVs 28.

FIG. 9 illustrates the bonding of package components 58 and 60 to package 48. Package components 58 and 60 may be packages, device dies, passive devices, and/or the like. In some exemplary embodiments, package component 58 is a device die, and package components 60 are discrete passive devices, which are not integrated on same chips as active devices such as transistors. For example, when the respective package is for a mobile application, package component 58 may be a base band die, and package components 60 are Multi-Layer Ceramic Capacitors (MLCC). The bonding may be performed using flip chip bonding through connectors 62, which may comprise solder, for example. It is appreciated that device dies 24, 25, and 58 may be arranged differently than in the illustrated exemplary embodiments. For example, the PMIC die or the TRX die may be device die 58, and the base band die may be one of device dies 24 and 25.

Figure 10:
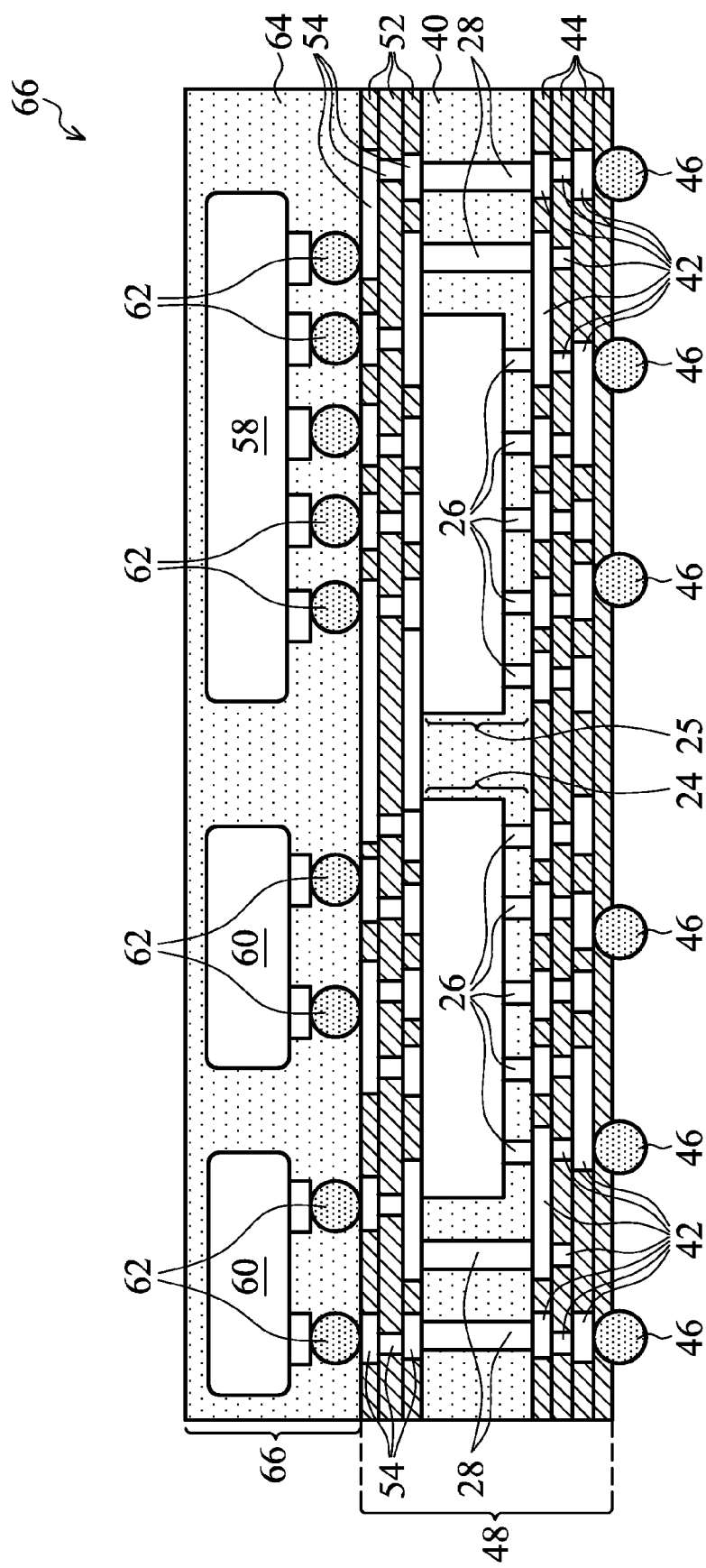

After the bonding of package components 58 and 60, package components 58 and 60 are molded, for example, in molding material 64. Molding material 64 may be in contact with bottom package 48. The resulting package components 58 and 60 and molding compound 64 thus form top package 66, which is bonded to the underlying bottom package 48. Accordingly, the resulting structure is a POP structure. Next, top package 66 and bottom package 48 are demounted from carrier 49. The resulting structure is shown in FIG. 10. The wafer-level package 48 may then be sawed into a plurality of POP structures 68, with each of the POP structures 68 including one top package 66 bonded to one bottom package 48.

In the embodiments, the plurality of device dies is embedded into bottom package 48 along with TAVs 28. The embedded bottom package 48 has a thickness smaller than the thickness of typical package substrates, and smaller than a combined thickness of an interposer and a package substrate. Accordingly, the resulting POP structure 68 has a reduced thickness compared to conventional structures in which device dies and package components are bonded to an interposer, which is further bonded on a package substrate. Furthermore, device dies 24 and 25 and package components 58 and 60 (FIG. 10) are stacked rather than being bonded on a same interposer (as in conventional structures). The total area occupied by device dies 24 and 25 and package components 58 and 60 are hence reduced compared to the conventional structures.

In accordance with embodiments, a device includes a top package bonded to a bottom package. The bottom package includes a molding material, a device die molded in the molding material, a TAV penetrating through the molding material, and a redistribution line over the device die. The top package includes a discrete passive device packaged therein. The discrete passive device is electrically coupled to the redistribution line.

In accordance with other embodiments, a device includes a top package and a bottom package. The bottom package includes a molding material, a first device die molded in the molding material, and a second device die molded in the molding material. The electrical connectors of the first and the second device dies have ends that are level with a surface of the molding material. The bottom package further includes a plurality of TAVs penetrating through the molding material, wherein the ends of the electrical connectors of the first and the second device dies are level with ends of the plurality of TAVs. The bottom package further includes a first redistribution layer on a first side of the molding material, wherein the first redistribution layer includes a first plurality of redistribution lines, and a second redistribution layer on a second side of the molding material opposite the first side, wherein the second redistribution layer includes a second plurality of redistribution lines. The top package includes a discrete capacitor packaged therein, wherein the discrete capacitor is bonded to the bottom package.

In accordance with yet other embodiments, a method includes forming a bottom package including placing a first device die and a second device die over a carrier, forming a plurality of TAVs over the carrier, molding the first device die, the second device die, and the plurality of TAVs in a molding material, and thinning the molding material. After the step of thinning, top ends of the plurality of TAVs and top ends of electrical connectors of the first device die and the second device die are exposed through the molding material.

The formation of the bottom package further includes forming a plurality of RDLs on a side of the molding material, wherein the plurality of RDLs is electrically coupled to the plurality of TAVs. The method further includes forming a top package, which includes bonding a discrete passive device to the bottom package.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
bonding a discrete passive device to a package, wherein the package comprises:
a first molding material;
a first device die molded in the first molding material, wherein the first device die comprises metal posts;
a Through Assembly Via (TAV) penetrating through the first molding material; and
a first redistribution line over the first molding material; and
molding the discrete passive device in a second molding material, wherein the discrete passive device is bonded directly to the package, and an entirety of the discrete passive device is embedded in and surrounded by the second molding material.

2. The method of claim 1, wherein after the bonding, the discrete passive device is electrically coupled to the first redistribution line and the TAV.

3. The method of claim 1 further comprising, before the molding, bonding a second device die to the package, with the second device die molded in the second molding material.

4. The method of claim 3, wherein the second device die is bonded directly to the package.

5. The method of claim 1, wherein a top surface of the second molding material is higher than a top surface of the discrete passive device.

6. The method of claim 1, wherein the first redistribution line is in a dielectric layer, and edges of the dielectric layer are aligned with respective edges of the second molding material.

7. A method comprising:
bonding a first device die directly to a package, wherein the package comprises:
a first molding material, the first molding material comprising a first topmost surface and a first bottommost surface;
a second device die molded in the first molding material;
a Through Assembly Via (TAV) penetrating through the first molding material, the TAV comprising a second topmost surface and a second bottommost surface, wherein the second topmost surface is coplanar with the first topmost surface, and the second bottommost surface is coplanar with the first bottommost surface; and
a plurality of redistribution lines over the first molding material and electrically coupled to the second device die and the TAV; and
molding the first device die in a second molding material.

8. The method of claim 7, wherein after the bonding, the first device die is electrically coupled to the plurality of redistribution lines.

9. The method of claim 7 further comprising, before the molding, bonding a discrete passive device to the package, with the discrete passive device molded in the second molding material.

10. The method of claim 9, wherein the discrete passive device is bonded directly to the package.

11. The method of claim 7 further comprising forming the package comprising:
pre-forming the TAV; and
placing the TAV and the second device die over a carrier.

12. The method of claim 7 further comprising forming the package comprising:
performing a plating to form the TAV over a carrier; and
placing the second device die over the carrier.

13. The method of claim 7, wherein a top surface of the second molding material is higher than a top surface of the first device die.

14. The method of claim 7, wherein an entirety of the first device die is encapsulated in the second molding material.

15. The method of claim 7, wherein the plurality of redistribution lines are formed in a plurality of dielectric layers, and edges of the plurality of dielectric layers are aligned with respective edges of the second molding material.

16. A method comprising:
bonding a discrete passive device to a package, wherein the package comprises:
a first molding material;
a first device die molded in the first molding material, wherein the first device die comprises metal posts, the first device die comprising a first surface and a second surface opposite the first surface, the metal posts comprising third surfaces and fourth surfaces opposite the third surfaces, wherein the first surface is coplanar with a topmost surface of the first molding material, the third surfaces physically contact the second surface, and the fourth surfaces are coplanar with a bottommost surface of the first molding material;
a Through Assembly Via (TAV) penetrating through the first molding material; and
a first redistribution line over the first molding material;
bonding a second device die to the package; and
molding the discrete passive device and the second device die in a second molding material.

17. The method of claim 16, wherein after the bonding, the discrete passive device is electrically coupled to the first redistribution line and the TAV.

18. The method of claim 16, wherein the discrete passive device is bonded directly to the package, and an entirety of the discrete passive device is embedded in the second molding material.

19. The method of claim 16, wherein the second device die is bonded directly to the package.

20. The method of claim 16, wherein a top surface of the second molding material is higher than a top surface of the discrete passive device.

* * * * *